United States Patent
Chiang et al.

(10) Patent No.: US 9,865,748 B2
(45) Date of Patent: Jan. 9, 2018

(54) SEMICONDUCTOR STRUCTURE AND METHOD FOR MANUFACTURING THE SAME

(71) Applicant: TAIWAN SEMICONDUCTOR MANUFACTURING CO., LTD., Hsinchu (TW)

(72) Inventors: Hsin-Chih Chiang, Hsinchu (TW); Tung-Yang Lin, New Taipei (TW); Chih-Chang Cheng, Hsinchu (TW); Ruey-Hsin Liu, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/488,325

(22) Filed: Apr. 14, 2017

(65) Prior Publication Data

US 2017/0222063 A1    Aug. 3, 2017

Related U.S. Application Data

(63) Continuation of application No. 14/026,580, filed on Sep. 13, 2013, now Pat. No. 9,627,551.

(51) Int. Cl.
| | |
|---|---|
| *H01L 29/68* | (2006.01) |
| *H01L 29/87* | (2006.01) |
| *H01L 29/66* | (2006.01) |
| *H01L 29/06* | (2006.01) |

(52) U.S. Cl.
CPC .......... *H01L 29/87* (2013.01); *H01L 29/0607* (2013.01); *H01L 29/66121* (2013.01)

(58) Field of Classification Search
CPC ................. H01L 29/87; H01L 29/0607; H01L 29/66121; H01L 29/0821; H01L 29/0847; H01L 29/417; H01L 29/7801; H01L 29/68; H01L 27/1222; H01L 27/1288; H01L 29/42384; H01L 29/66757; H01L 29/78675; H01L 29/78696
USPC ........................................ 257/212; 438/141
See application file for complete search history.

(56) References Cited

U.S. PATENT DOCUMENTS

2004/0146701 A1    7/2004  Taguchi
2005/0029589 A1    2/2005  Takahashi et al.

*Primary Examiner* — Joseph C Nicely
*Assistant Examiner* — Pavel Ivanov
(74) *Attorney, Agent, or Firm* — Maschoff Brennan

(57) ABSTRACT

A semiconductor structure includes a semiconductor substrate having a first electrical portion, a second electrical portion, and a bridged conductive layer. The first electrical portion includes a first semiconductor well, a second semiconductor well in the first semiconductor well, and a third semiconductor well and a fourth semiconductor well in the second semiconductor well. The second electrical portion includes a fifth semiconductor well, a semiconductor layer in the fifth semiconductor well, and a sixth semiconductor well and a seventh semiconductor well in the fifth semiconductor well. The semiconductor layer has separated first and second portions. The bridged conductive layer connects the fourth semiconductor well and the sixth semiconductor well.

20 Claims, 14 Drawing Sheets

US 9,865,748 B2

SEMICONDUCTOR STRUCTURE AND METHOD FOR MANUFACTURING THE SAME

PRIORITY CLAIM AND CROSS-REFERENCE

The present application is a Continuation Application of the U.S. application Ser. No. 14/026,580, filed Sep. 13, 2013, which is herein incorporated by reference.

BACKGROUND

The present disclosure relates to a semiconductor structure, and more particularly, to a semiconductor structure capable of sustaining ultrahigh-voltage and method for manufacturing the same.

An ultrahigh-voltage (UHV) semiconductor device, which can sustain a higher voltage operation, is one of the most important devices utilized in modern integrated circuits. Generally, the higher voltage operation refers to an application of an UHV input (>100V) from an external source to an UHV device.

A common UHV semiconductor device usually includes high voltage circuits and low voltage circuits integrated into a single chip. In which, the high-voltage circuits are composed of an UHV semiconductor structure. The UHV semiconductor structure includes a P-type semiconductor substrate, an N-type semiconductor well in the P-type semiconductor substrate, a P-type semiconductor well in the N-type semiconductor well, and an anode on the P-type semiconductor well. Further, the P-type semiconductor substrate, the N-type semiconductor well and the P-type semiconductor well form a PNP bipolar structure.

However, during forward operation of a semiconductor diode, the UHV semiconductor structure has current leakage from a parasitic PNP bipolar structure. When the current leakage occurs at UHV operation, the current may flow from the anode to the P-type semiconductor substrate and damage the UHV semiconductor device causing electrical failure thereof. Accordingly, improvements in structures and methods for fabricating the UHV semiconductor device continue to be sought.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
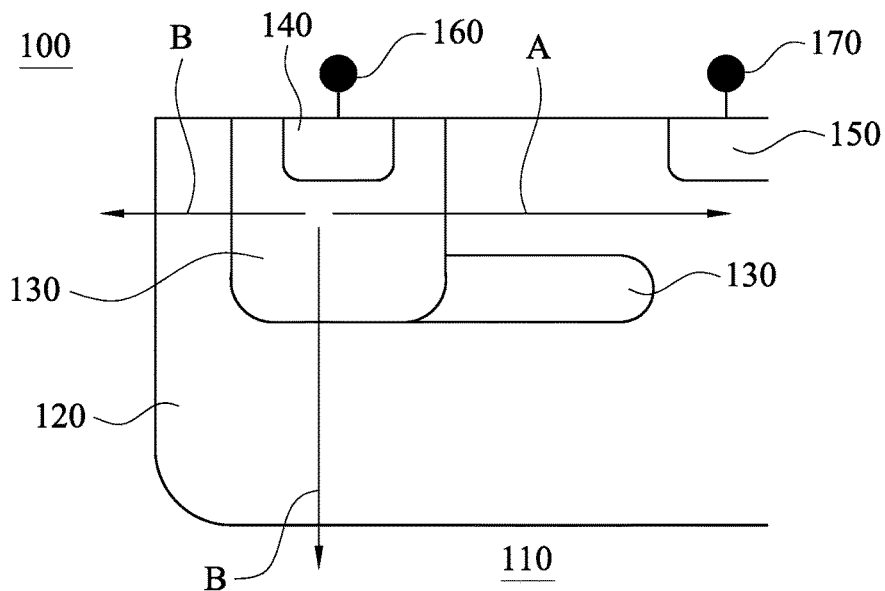
FIG. 1A is a schematic cross-sectional view of a general ultrahigh-voltage (UHV) semiconductor structure.

The embodiments of ultrahigh-voltage (UHV) semiconductor structures and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a semiconductor well includes embodiments having two or more such semiconductor wells, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

FIG. 1A is a schematic cross-sectional view of a general UHV semiconductor structure 100. The UHV semiconductor structure 100 includes a P-type semiconductor substrate (P sub) 110, a lightly doped N-type semiconductor (N−) well 120, a P-type semiconductor (P) well 130, a heavily doped P-type semiconductor (P+) well 140, a heavily doped N-type semiconductor (N+) well 150, an anode 160 and a cathode 170.

The N− well 120 is positioned in the P sub 110, and then the P well 130 is positioned in the N− well 120. The P+ well 140 is positioned in the P well 130. And the N+ well 150 is positioned in the N− well 120. Finally, the anode 160 and the cathode 170 are individually positioned on the P+ well 140 and the N+ well 150.

When the anode is applied under low-voltage operation, the current flows a normal pathway from the anode to the cathode, as the arrow A shown in FIG. 1A. Under high-voltage operation, the current leakage is occurred, so that the current flows from the anode to P sub (the arrow B), so as to damage the electric device. Referring to the FIG. 1B, the curve diagram illustrates the current leakage occurred in the UHV semiconductor structure 100.

Figure 1B:
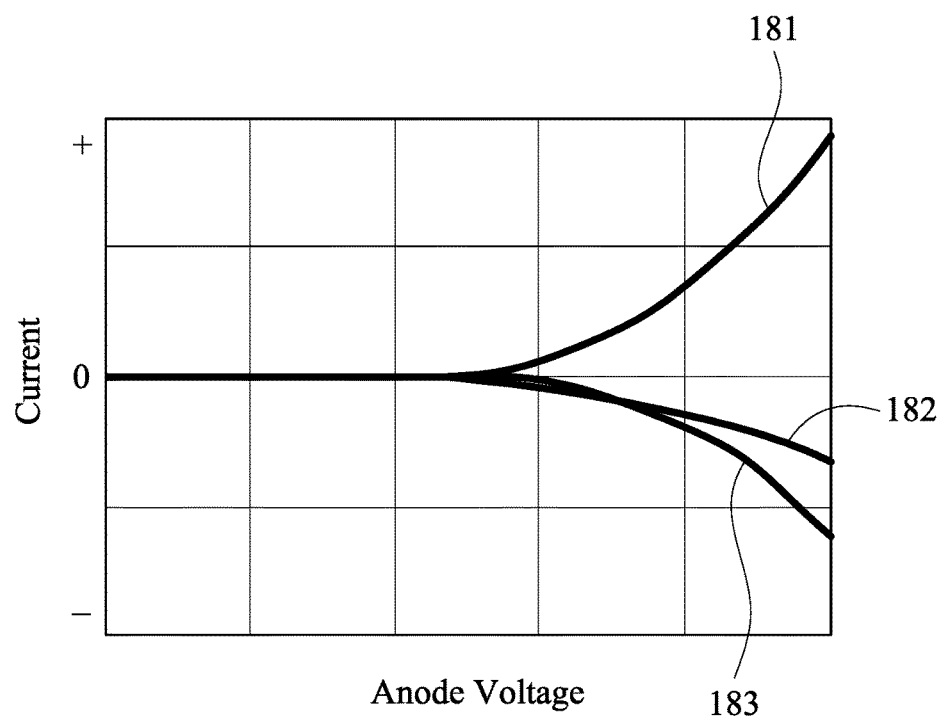
FIG. 1B is a curve diagram of the relationship between the anode voltage and the current of the general UHV semiconductor structure shown in FIG. 1A.

FIG. 1B is a curve diagram of the relationship between the anode voltage and the current of the anode, the cathode and the P-type substrate in the UHV semiconductor structure 100 shown in FIG. 1A, wherein the voltage of the cathode is 0 V and the P-type substrate is taken as a reference point which is equal to 0 V in the present disclosure. In FIG. 1B, the curve 181 is the relationship between the anode voltage and the current of the anode. The line 182 is the relationship between the anode voltage and the current of the P sub. And, the curve 183 is the relationship between the anode voltage and the current of the cathode.

Generally, the sum of the anode current, the P sub current and the cathode current at the P well 130 must be 0. And, if the current of the P sub is not equal to 0, the current leakage is occurred. Referring to FIG. 1B, when the anode is applied under high-voltage operation, the current of the P sub is not equal to 0, so that the UHV semiconductor structure 100 has current leakage under high-voltage operation.

Figure 2A:
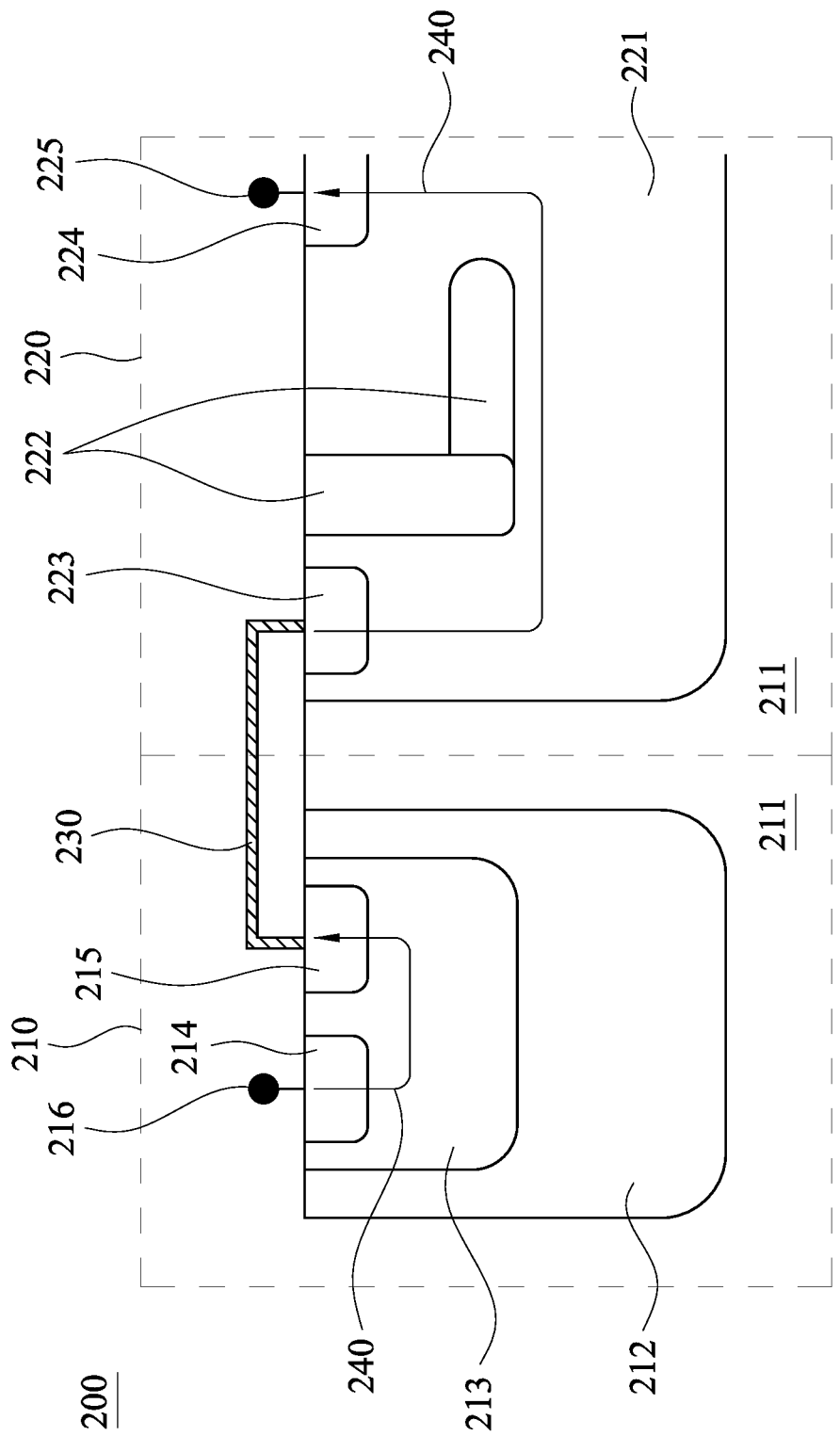
FIG. 2A is a schematic cross-sectional view of an UHV semiconductor structure according to various embodiments of the present disclosure.

Referring to FIG. 2A, a schematic cross-sectional view of an UHV semiconductor structure 200 is shown according to various embodiments of the present disclosure. In FIG. 2A, the UHV semiconductor structure 200 includes a first electrical portion 210, a second electrical portion 220, and a bridged conductive layer 230, wherein the first electrical portion 210 and the second electrical portion 220 are positioned in a semiconductor substrate 211.

The first electrical portion 210 includes a first semiconductor well 212, a second semiconductor well 213, a third semiconductor well 214, a fourth semiconductor well 215, and a first electrode 216. In FIG. 2A, the first semiconductor well 212 is positioned in the semiconductor substrate 211. The second semiconductor well 213 is positioned in the first semiconductor well 212. The third semiconductor well 214 and the fourth semiconductor well 215 are in the second semiconductor well 213, and both of them are completely separated by a region of the second semiconductor well 213. And the first electrode 216 is electrically connected to the third semiconductor well 214.

According to various embodiments of the present disclosure, the semiconductor substrate and the second semiconductor well are a P-type semiconductor; and the third semiconductor well is a heavily doped P-type semiconductor (P+).

According to various embodiments of the present disclosure, the first semiconductor well is a lightly doped N-type semiconductor (N−); and the fourth semiconductor well is a heavily doped N-type semiconductor (N+).

According to various embodiments of the present disclosure, the first electrode is an anode.

According to various embodiments of the present disclosure, the potential of the first semiconductor well is equal to or larger than the second semiconductor well.

The second electrical portion 220 includes a fifth semiconductor well 221, a semiconductor layer 222, a sixth semiconductor well 223, a seventh semiconductor well 224, and a second electrode 225. In FIG. 2A, the fifth semiconductor well 221 is positioned in the semiconductor substrate 211. The semiconductor layer 222 is positioned in the fifth semiconductor well 221. The sixth semiconductor well 223 and the seventh semiconductor well 224 are in the fifth semiconductor well 221, and the current along the geometrically shortest pathway between the sixth semiconductor well 223 and the seventh semiconductor well 224 is obstructed by the semiconductor layer 222. And the second electrode 225 is electrically connected to the seventh semiconductor well 224.

According to various embodiments of the present disclosure, the semiconductor layer is a P-type semiconductor. According to another embodiment of the present disclosure, the semiconductor layer is in an L-shape, as shown in FIG. 2A.

According to various embodiments of the present disclosure, the fifth semiconductor well is a lightly doped N-type semiconductor (N−); and the sixth semiconductor well and the seventh semiconductor well are a heavily doped N-type semiconductor (N+).

According to various embodiments of the present disclosure, the second electrode is a cathode.

In FIG. 2A, the bridged conductive layer 230 is directly connected between the fourth semiconductor well 215 of the first electrical portion 210 and the sixth semiconductor well 223 of the second electrical portion 220.

According to various embodiments of the present disclosure, the bridged conductive layer is a conductive material, such as a metal, an alloy or a nonmetal conductor.

Figure 2B:
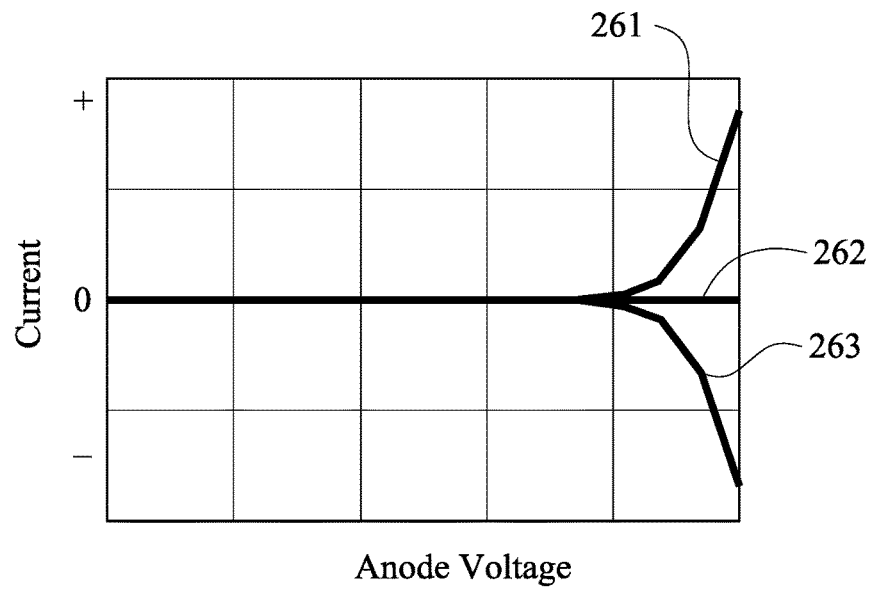
FIG. 2B is a curve diagram of the relationship between the anode voltage and the current of the UHV semiconductor structure shown in FIG. 2A.

FIG. 2B is a curve diagram of the relationship between the anode voltage and the current of the UHV semiconductor structure according to various embodiments of the present disclosure, wherein the voltages of the cathode and the P-type semiconductor substrate are 0 V. In FIG. 2B, the curve 261 is the relationship between the anode voltage and the current of the anode. The line 262 is the relationship between the anode voltage and the current of the P-type semiconductor substrate. And, the curve 263 is the relationship between the anode voltage and the current of the cathode.

When the potential of the cathode and the P-type semiconductor substrate of the UHV structure are 0 V, the current of the P-type semiconductor substrate is 0, shown as the line 262, and the sum of the currents of the anode and the cathode at the second semiconductor well 213 is 0, shown as the curve 261 and 263. Therefore, there is no current leakage occurred in the semiconductor structure, and more particularly, in the semiconductor structure capable of UHV operation. And the absolute value of the anode current is equal to that of the cathode current.

As mentioned above, in FIG. 2A, the arrow 240 indicates that, the current can only flow from the anode to the cathode, but not flow through the P-N (213-212) junction to occur current leakage. Therefore, the semiconductor structure can be capable of sustaining UHV, but not damage the electric device.

Figure 2C:
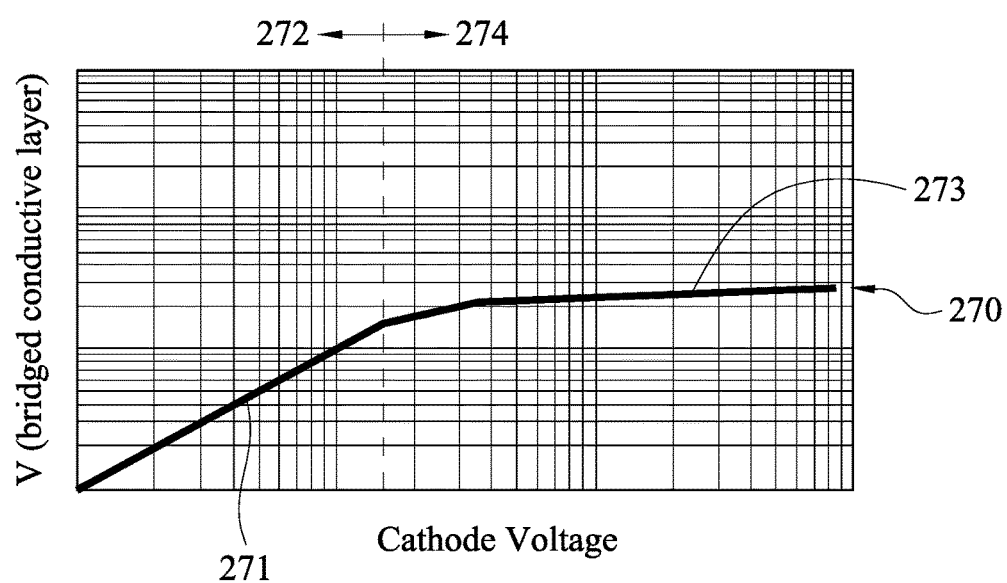
FIG. 2C is a curve diagram of the relationship between the cathode voltage and the voltage of the bridged conductive layer in the UHV semiconductor structure shown in FIG. 2A.

FIG. 2C is a curve diagram 270 of the relationship between the cathode voltage and the voltage of the bridged conductive layer in the UHV semiconductor structure according to various embodiments of the present disclosure, wherein the voltages of the anode and the P-type semiconductor substrate are 0 V.

In FIG. 2C, there is a linear relationship 271 between voltages of the cathode and the bridged conductive layer at low-voltage, an initial stage 272. And the slope of the linear relationship 271 is at a maximum.

When the cathode voltage is kept rising, the slope of the curve 270 becomes lower to give a non-linear relationship 273, and the voltage of the bridged conductive layer may be a saturated constant. In which, the curve 270 is at a saturated stage 274. The curve 270 in FIG. 2C indicates that, the semiconductor structure can be capable of UHV operation, but not overloaded the current through the bridged conductive layer. So that, the semiconductor structure in various embodiments of the present disclosure has higher reliability and safety in use.

Figure 3A:
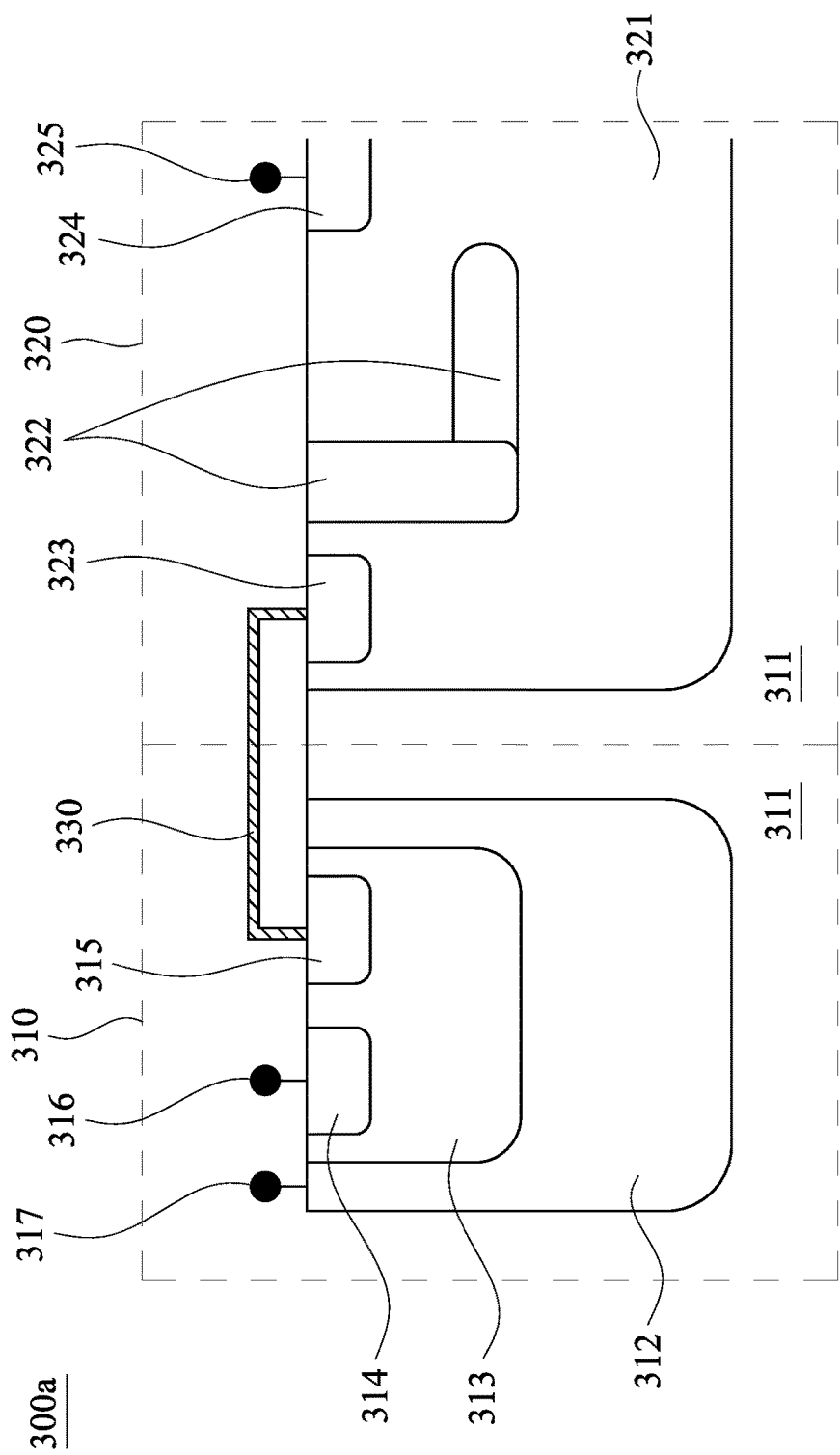
FIG. 3A-3C are schematic cross-sectional views of UHV semiconductor structures according to various embodiments of the present disclosure.
Figure 3B:
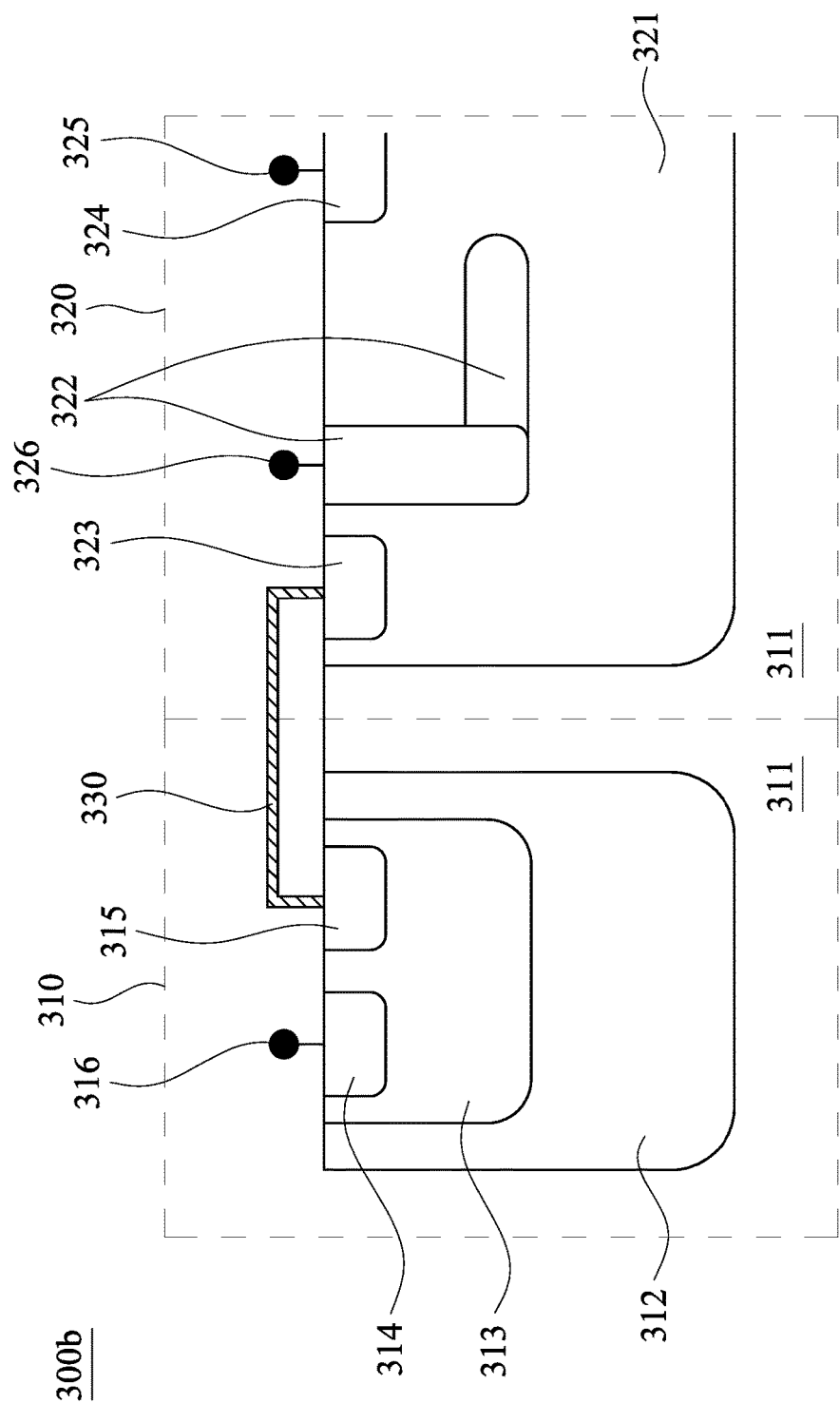
Figure 3C:
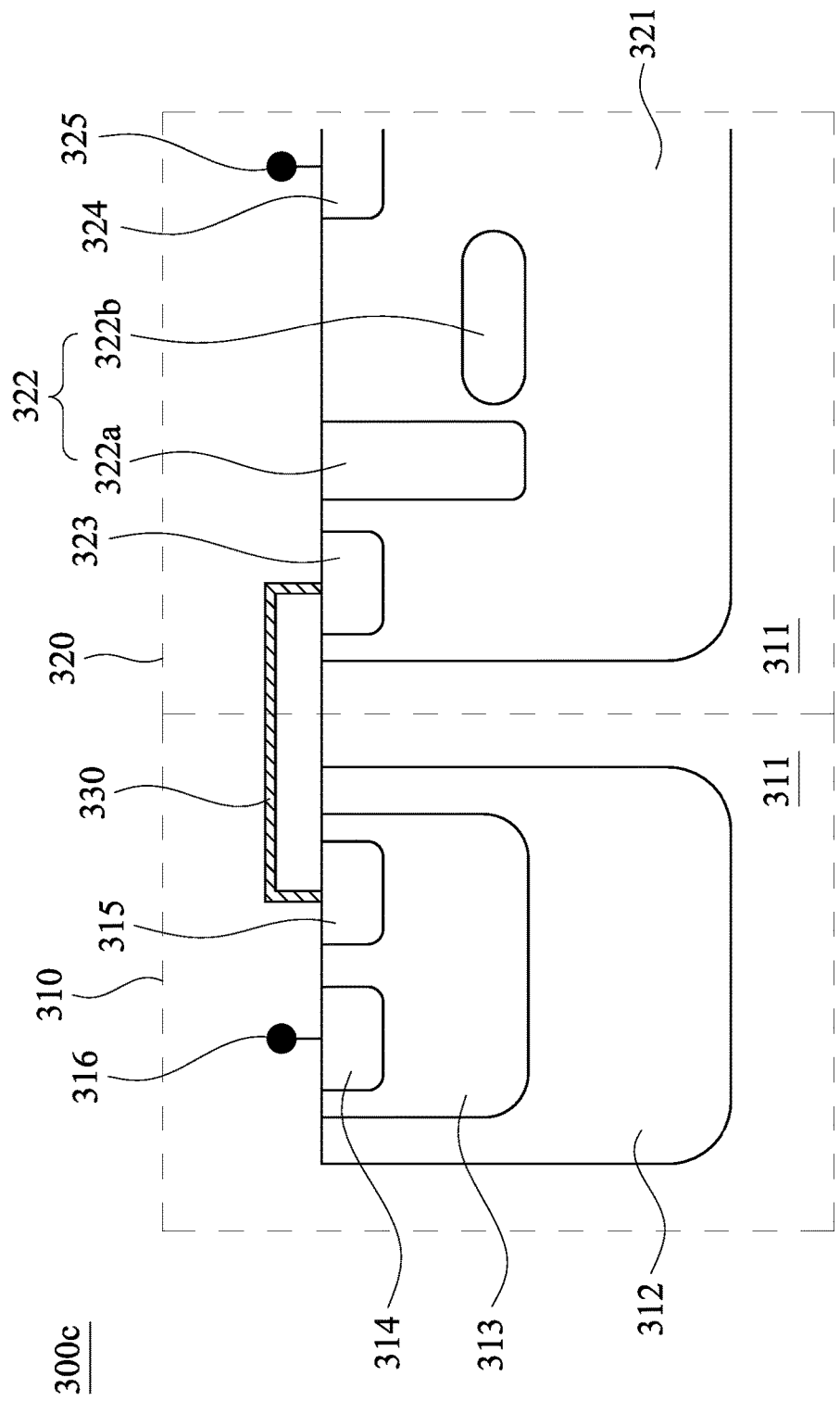

FIG. 3A-3C are schematic cross-sectional views of ultra-voltage semiconductor structures 300a-300c according to various embodiments of the present disclosure.

In FIG. 3A, the UHV semiconductor structure 300a includes a first electrical portion 310, a second electrical portion 320, and a bridged conductive layer 330.

The first electrical portion 310 includes a semiconductor substrate 311, a first semiconductor well 312, a second semiconductor well 313, a third semiconductor well 314, a fourth semiconductor well 315, and a first electrode 316. In FIG. 3A, the first semiconductor well 312 is positioned in the semiconductor substrate 311. The second semiconductor well 313 is positioned in the first semiconductor well 312. The third semiconductor well 314 and the fourth semiconductor well 315 are in the second semiconductor well 313, and both of them are completely separated by a region of the second semiconductor well 313. And the first electrode 316 is electrically connected to the third semiconductor well 314.

Different from the semiconductor structure 200 in FIG. 2A, the semiconductor structure 300a further includes a bias 317 applied to the first semiconductor well 312 of the first electrical portion 310. Because the first semiconductor well 312 is biased, the potential of the first semiconductor well 312 is larger than the second semiconductor well 313. Therefore, the current does not flow through the P-N (313-312) junction to occur current leakage, so as to prevent the damage of an electric device having the semiconductor structure.

The second electrical portion 320 includes a fifth semiconductor well 321, a semiconductor layer 322, a sixth semiconductor well 323, a seventh semiconductor well 324, and a second electrode 325. In FIG. 3B, the fifth semiconductor well 321 is positioned in the semiconductor substrate 311. The semiconductor layer 322 is positioned in the fifth semiconductor well 321. The sixth semiconductor well 323 and the seventh semiconductor well 324 are in the fifth semiconductor well 321, and the current along the geometrically shortest pathway between the sixth semiconductor well 323 and the seventh semiconductor well 324 is obstructed by the semiconductor layer 322. And the second electrode 325 is electrically connected to the seventh semiconductor well 324.

In FIG. 3A, the bridged conductive layer 330 is directly connected between the fourth semiconductor well 315 of the first electrical portion 310 and the sixth semiconductor well 323 of the second electrical portion 320.

In FIG. 3B, the UHV semiconductor structure 300b includes a first electrical portion 310, a second electrical portion 320, and a bridged conductive layer 330.

The first electrical portion 310 includes a semiconductor substrate 311, a first semiconductor well 312, a second semiconductor well 313, a third semiconductor well 314, a fourth semiconductor well 315, and a first electrode 316. In FIG. 3B, the first semiconductor well 312 is positioned in the semiconductor substrate 311. The second semiconductor well 313 is positioned in the first semiconductor well 312. The third semiconductor well 314 and the fourth semiconductor well 315 are in the second semiconductor well 313, and both of them are completely separated by a region of the second semiconductor well 313. And the first electrode 316 is electrically connected to the third semiconductor well 314.

In various embodiments, the second electrical portion 320 includes a fifth semiconductor well 321, a semiconductor layer 322, a sixth semiconductor well 323, a seventh semiconductor well 324, and a second electrode 325. In FIG. 3B, the fifth semiconductor well 321 is positioned in the semiconductor substrate 311. The semiconductor layer 322 is positioned in the fifth semiconductor well 321. The sixth semiconductor well 323 and the seventh semiconductor well 324 are in the fifth semiconductor well 321, and the current along the geometrically shortest pathway between the sixth semiconductor well 323 and the seventh semiconductor well 324 is obstructed by the semiconductor layer 322. And the second electrode 325 is electrically connected to the seventh semiconductor well 324.

Different from the semiconductor structure 200 in FIG. 2A, the semiconductor structure 300b further includes a bias 326 applied to the semiconductor layer 322 of the second electrical portion 320. Because the semiconductor layer 322 is biased, the potential of the semiconductor layer 322 is lower than the fifth semiconductor well 321. Therefore, the current may go round the semiconductor layer 322 toward the second electrode 325.

In FIG. 3B, the bridged conductive layer 330 is directly connected between the fourth semiconductor well 315 of the first electrical portion 310 and the sixth semiconductor well 323 of the second electrical portion 320.

In FIG. 3C, the UHV semiconductor structure 300c includes a first electrical portion 310, a second electrical portion 320, and a bridged conductive layer 330.

The first electrical portion 310 includes a semiconductor substrate 311, a first semiconductor well 312, a second semiconductor well 313, a third semiconductor well 314, a fourth semiconductor well 315, and a first electrode 316. In FIG. 3C, the first semiconductor well 312 is positioned in the semiconductor substrate 311. The second semiconductor well 313 is positioned in the first semiconductor well 312. The third semiconductor well 314 and the fourth semiconductor well 315 are in the second semiconductor well 313, and both of them are completely separated by a region of the second semiconductor well 313. And the first electrode 316 is electrically connected to the third semiconductor well 314.

The second electrical portion 320 includes a fifth semiconductor well 321, a semiconductor layer 322, a sixth semiconductor well 323, a seventh semiconductor well 324, and a second electrode 325. In FIG. 3C, the fifth semiconductor well 321 is positioned in the semiconductor substrate 311. The semiconductor layer 322 is positioned in the fifth semiconductor well 321. The sixth semiconductor well 323 and the seventh semiconductor well 324 are in the fifth semiconductor well 321, and the current along the geometrically shortest pathway between the sixth semiconductor well 323 and the seventh semiconductor well 324 is obstructed by the semiconductor layer 322. And the second electrode 325 is electrically connected to the seventh semiconductor well 324.

Different from the semiconductor structure 200 in FIG. 2A, the semiconductor layer 322 of the semiconductor structure 300c has a vertical portion 322a and a horizontal portion 322b, wherein the vertical portion 322a and the horizontal portion 322b are completely separated by a region of the fifth semiconductor well 321.

In FIG. 3C, the bridged conductive layer 330 is directly connected between the fourth semiconductor well 315 of the first electrical portion 310 and the sixth semiconductor well 323 of the second electrical portion 320.

FIGS. 4A-4D are schematic cross-sectional views of ultra-voltage semiconductor structures 400a-400d according to various embodiments of the present disclosure.

Figure 4A:
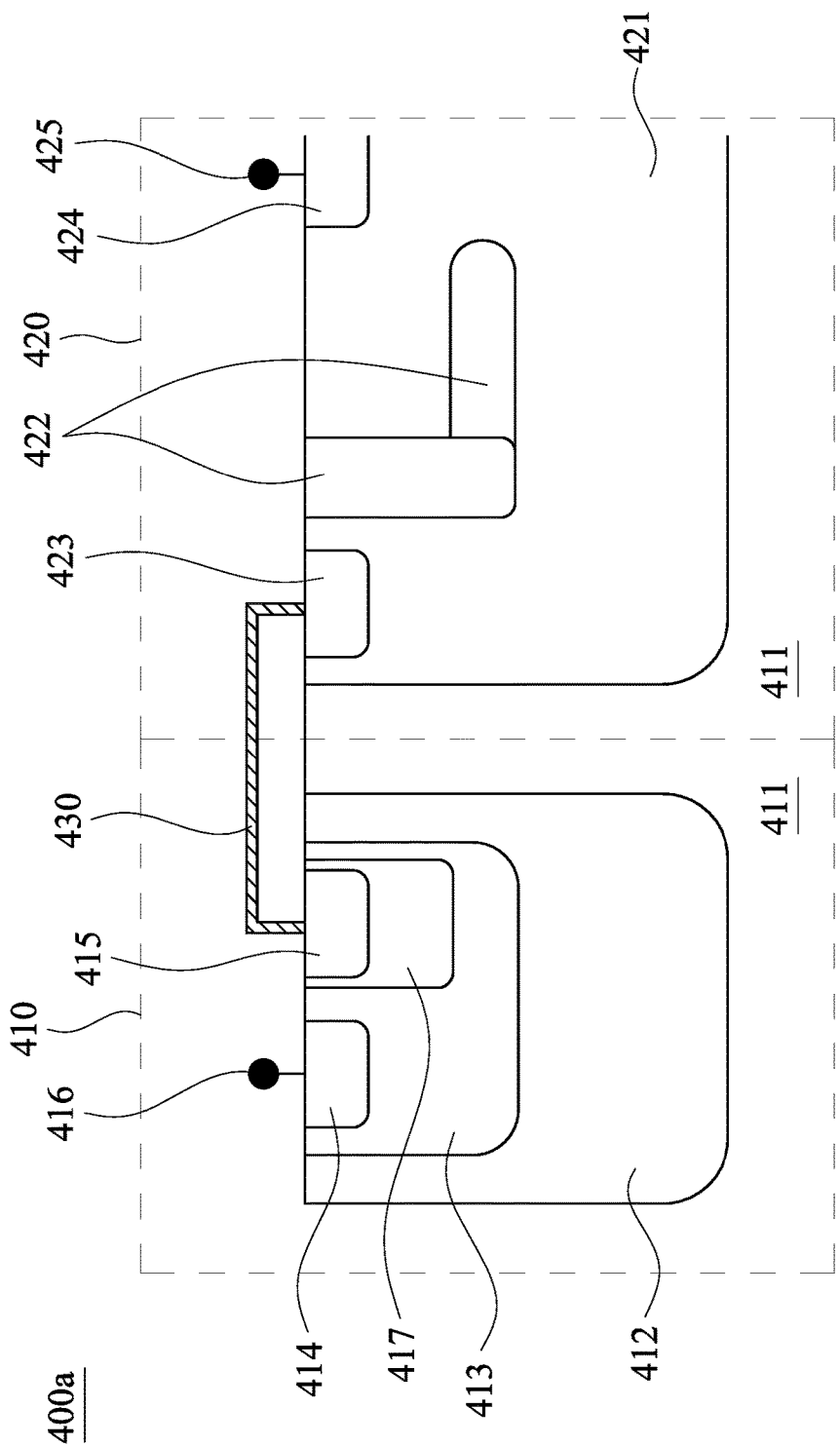
FIGS. 4A-4D are schematic cross-sectional views of UHV semiconductor structures according to various embodiments of the present disclosure.

In FIG. 4A, the UHV semiconductor structure 400a includes a first electrical portion 410, a second electrical portion 420, and a bridged conductive layer 430.

The first electrical portion 410 includes a semiconductor substrate 411, a first semiconductor well 412, a second semiconductor well 413, a third semiconductor well 414, a fourth semiconductor well 415, a first electrode 416, and an eighth semiconductor layer 417. In FIG. 4A, the first semiconductor well 412 is positioned in the semiconductor substrate 411. The second semiconductor well 413 is positioned in the first semiconductor well 412. The third semiconductor well 414 and the fourth semiconductor well 415 are in the second semiconductor well 413, and both of them are completely separated by a region of the second semiconductor well 413. And the first electrode 416 is electrically connected to the third semiconductor well 414.

Different from the semiconductor structure 200 in FIG. 2A, the semiconductor structure 400a further includes an eighth semiconductor well 417 sandwiched between the second semiconductor well 413 and the fourth semiconductor well 415. In detailed description, the eighth semiconductor well 417 is positioned in the second semiconductor well 413, and then the fourth semiconductor well 415 is positioned in the eighth semiconductor well 417.

According to various embodiments of the present disclosure, the eighth semiconductor well is an N-type semiconductor.

Figure 4B:
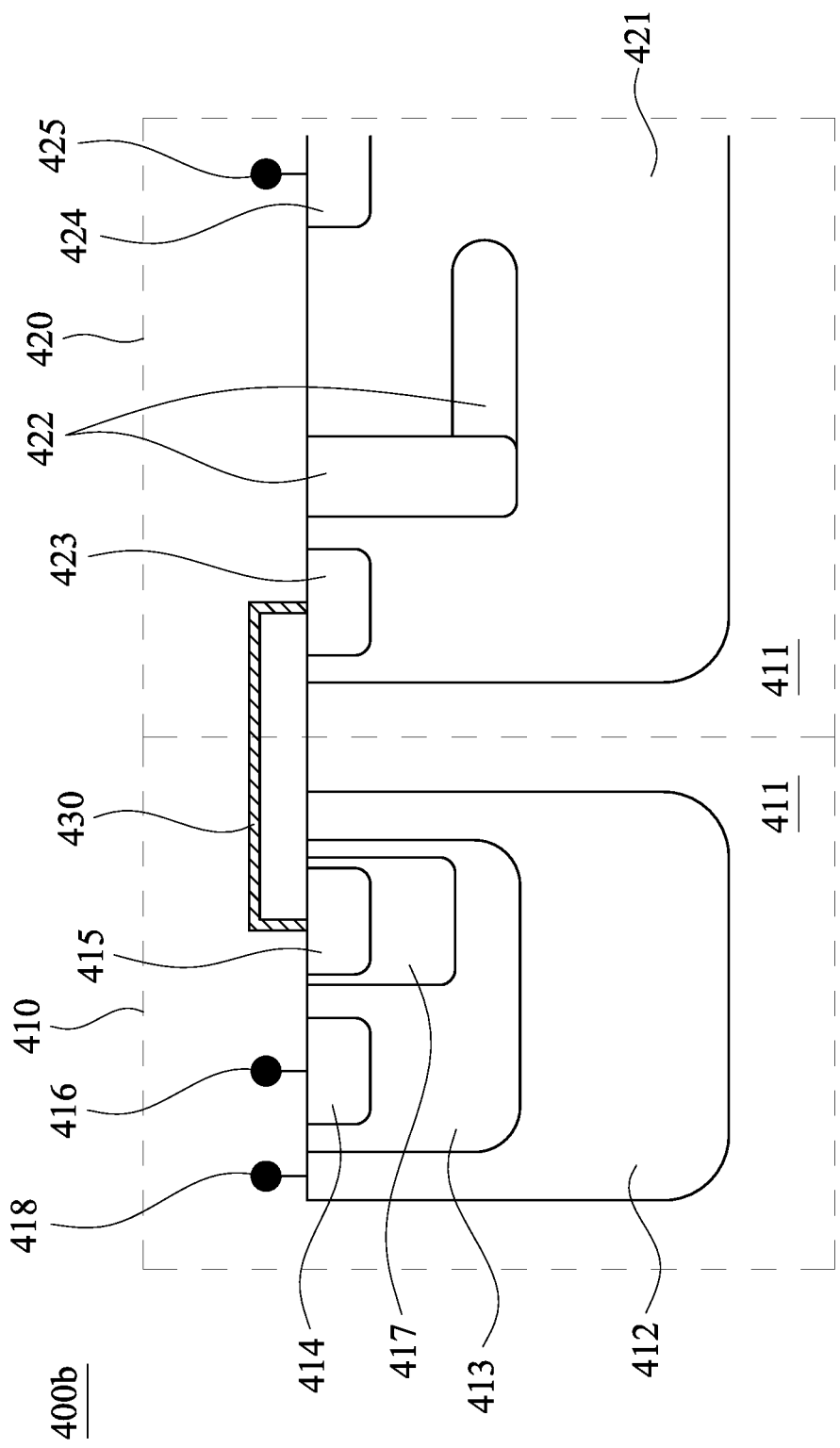

The second electrical portion 420 includes a fifth semiconductor well 421, a semiconductor layer 422, a sixth semiconductor well 423, a seventh semiconductor well 424, and a second electrode 425. In FIG. 4B, the fifth semiconductor well 421 is positioned in the semiconductor substrate 411. The semiconductor layer 422 is positioned in the fifth semiconductor well 421, wherein the semiconductor layer 422 is in an L-shape. The sixth semiconductor well 423 and the seventh semiconductor well 424 are in the fifth semiconductor well 421, and the current along the geometrically shortest pathway between the sixth semiconductor well 423 and the seventh semiconductor well 424 is obstructed by the semiconductor layer 422. And the second electrode 425 is electrically connected to the seventh semiconductor well 424.

In FIG. 4A, the bridged conductive layer 430 is directly connected between the fourth semiconductor well 415 of the first electrical portion 410 and the sixth semiconductor well 423 of the second electrical portion 420.

In FIG. 4B, the UHV semiconductor structure 400b includes a first electrical portion 410, a second electrical portion 420, and a bridged conductive layer 430.

The first electrical portion 410 includes a semiconductor substrate 411, a first semiconductor well 412, a second semiconductor well 413, a third semiconductor well 414, a fourth semiconductor well 415, a first electrode 416, and an eighth semiconductor layer 417. In FIG. 4B, the first semiconductor well 412 is positioned in the semiconductor substrate 411. The second semiconductor well 413 is positioned in the first semiconductor well 412. The third semiconductor well 414 and the eighth semiconductor well 417 are in the second semiconductor well 413, and both of them are completely separated by a portion of the second semiconductor well 413. The fourth semiconductor well 415 is positioned in the eighth semiconductor well 417. And the first electrode 416 is electrically connected to the third semiconductor well 414.

Different from the semiconductor structure 400a in FIG. 4A, the semiconductor structure 400b further includes a bias 418 applied to the first semiconductor well 412 of the first electrical portion 410. Because the first semiconductor well 412 is biased, the potential of the first semiconductor well 412 is larger than the second semiconductor well 413. Therefore, the current does not flow through the P-N (413-412) junction to occur current leakage, so as to prevent the damage of an electric device having the semiconductor structure.

The second electrical portion 420 includes a fifth semiconductor well 421, a semiconductor layer 422, a sixth semiconductor well 423, a seventh semiconductor well 424, and a second electrode 425. In FIG. 4B, the fifth semiconductor well 421 is positioned in the semiconductor substrate 411. The semiconductor layer 422 is positioned in the fifth semiconductor well 421, wherein the semiconductor layer 422 is in an L-shape. The sixth semiconductor well 423 and the seventh semiconductor well 424 are positioned in the fifth semiconductor well 421, and the current along the geometrically shortest pathway between the sixth semiconductor well 423 and the seventh semiconductor well 424 is obstructed by the semiconductor layer 422. And the second electrode 425 is electrically connected to the seventh semiconductor well 424.

In FIG. 4B, the bridged conductive layer 430 is directly connected between the fourth semiconductor well 415 of the first electrical portion 410 and the sixth semiconductor well 423 of the second electrical portion 420.

Figure 4C:
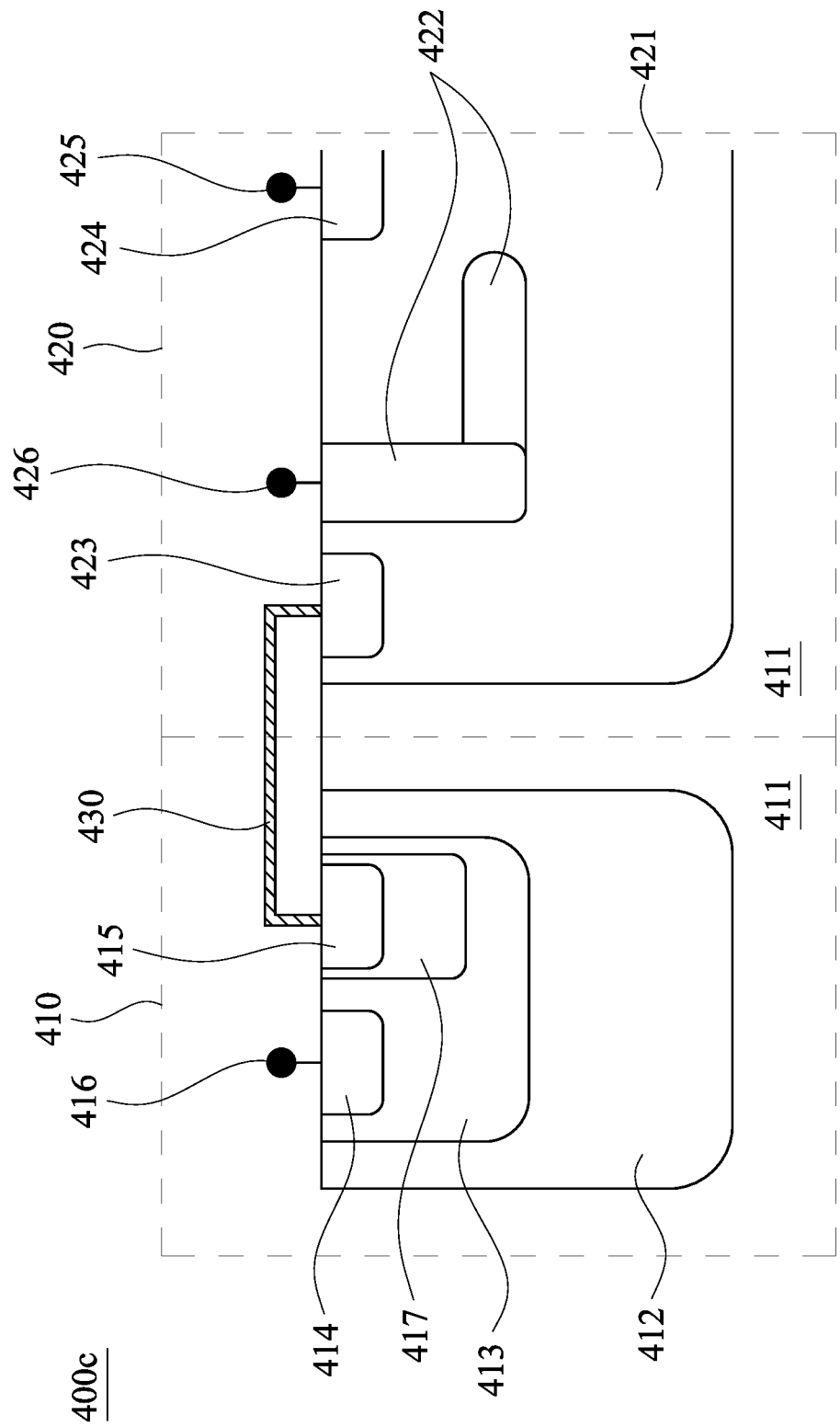

In FIG. 4C, the UHV semiconductor structure 400c includes a first electrical portion 410, a second electrical portion 420, and a bridged conductive layer 430.

The first electrical portion 410 includes a semiconductor substrate 411, a first semiconductor well 412, a second semiconductor well 413, a third semiconductor well 414, a fourth semiconductor well 415, a first electrode 416, and an eighth semiconductor layer 417. In FIG. 4C, the first semiconductor well 412 is positioned in the semiconductor substrate 411. The second semiconductor well 413 is positioned in the first semiconductor well 412. The third semiconductor well 414 and the eighth semiconductor well 417 are positioned in the second semiconductor well 413, and both of them are completely separated by a region of the second semiconductor well 413. The fourth semiconductor well 415 is positioned in the eighth semiconductor well 417. And the first electrode 416 is electrically connected to the third semiconductor well 414.

The second electrical portion 420 includes a fifth semiconductor well 421, a semiconductor layer 422, a sixth semiconductor well 423, a seventh semiconductor well 424, and a second electrode 425. In FIG. 4B, the fifth semiconductor well 421 is positioned in the semiconductor substrate 411. The semiconductor layer 422 is positioned in the fifth semiconductor well 421, wherein the semiconductor layer 422 is in an L-shape. The sixth semiconductor well 423 and the seventh semiconductor well 424 are in the fifth semiconductor well 421, and the current along the geometrically shortest pathway between the sixth semiconductor well 423 and the seventh semiconductor well 424 is obstructed by the semiconductor layer 422. And the second electrode 425 is electrically connected to the seventh semiconductor well 424.

Different from the semiconductor structure 400a in FIG. 4A, the semiconductor structure 400c further includes a bias 426 applied to the semiconductor layer 422 of the second electrical portion 420. Because the semiconductor layer 422 is biased, the potential of the semiconductor layer 422 is lower than the fifth semiconductor well 421. Therefore, the current may go round the semiconductor layer 422 toward the second electrode 425.

In FIG. 4C, the bridged conductive layer 430 is directly connected between the fourth semiconductor well 415 of the first electrical portion 410 and the sixth semiconductor well 423 of the second electrical portion 420.

Figure 4D:
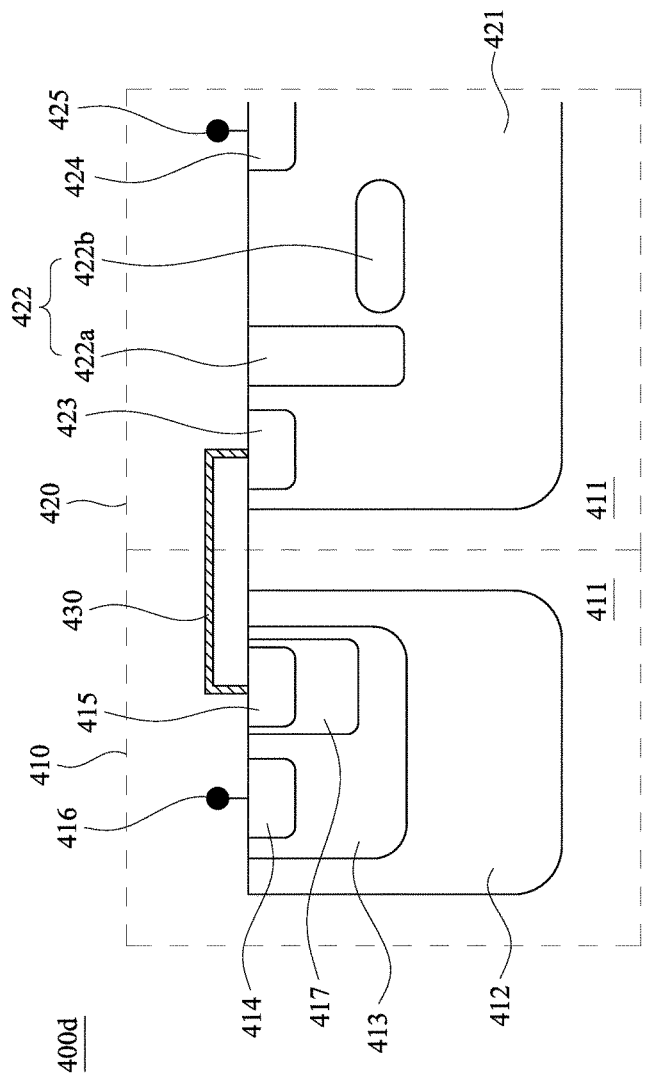

In FIG. 4D, the UHV semiconductor structure 400d includes a first electrical portion 410, a second electrical portion 420, and a bridged conductive layer 430.

The first electrical portion 410 includes a semiconductor substrate 411, a first semiconductor well 412, a second semiconductor well 413, a third semiconductor well 414, a fourth semiconductor well 415, a first electrode 416, and an eighth semiconductor layer 417. In FIG. 4D, the first semiconductor well 412 is positioned in the semiconductor substrate 411. The second semiconductor well 413 is positioned in the first semiconductor well 412. The third semiconductor well 414 and the eighth semiconductor well 417 are in the second semiconductor well 413, and both of them are completely separated by a region of the second semiconductor well 413. The fourth semiconductor well 415 is positioned in the eighth semiconductor well 417. And the first electrode 416 is electrically connected to the third semiconductor well 414.

The second electrical portion 420 includes a fifth semiconductor well 421, a semiconductor layer 422, a sixth semiconductor well 423, a seventh semiconductor well 424, and a second electrode 425. In FIG. 4D, the fifth semiconductor well 421 is in the semiconductor substrate 411. The semiconductor layer 422 is in the fifth semiconductor well 421, wherein the semiconductor layer 422 is in an L-shape. The sixth semiconductor well 423 and the seventh semiconductor well 424 are in the fifth semiconductor well 421, and the current along the geometrically shortest pathway between the sixth semiconductor well 423 and the seventh semiconductor well 424 is obstructed by the semiconductor layer 422. And the second electrode 425 is electrically connected to the seventh semiconductor well 424.

Different from the semiconductor structure 400 in FIG. 4A, the semiconductor layer 422 of the UHV semiconductor structure 400d has a vertical portion 422a and a horizontal portion 422b, wherein the vertical portion 422a and the horizontal portion 422b are completely separated by a region of the fifth semiconductor well 421.

In FIG. 4D, the bridged conductive layer 430 is directly connected between the fourth semiconductor well 415 of the first electrical portion 410 and the sixth semiconductor well 423 of the second electrical portion 420.

FIGS. 5A-5F are schematic cross-sectional views at various stages of a method fabricating an UHV semiconductor structure 500 according to various embodiments of the present disclosure. The method is able to locally repair all types of aforementioned defects, so as to avoid the current leakage occurring in the UHV semiconductor structure according to various embodiments of the present disclosure.

Figure 5A:
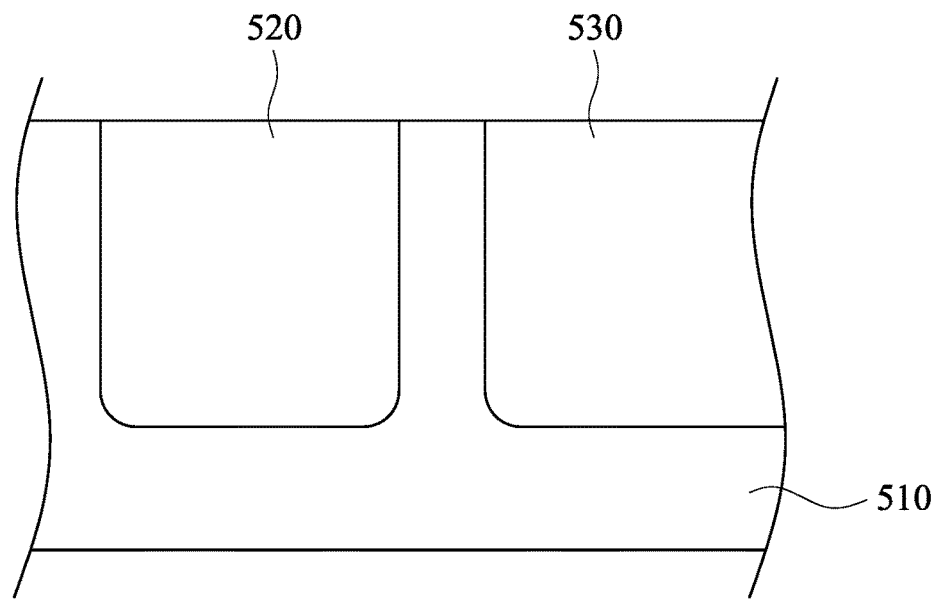
FIGS. 5A-5F are schematic cross-sectional views at various stages of fabricating an UHV semiconductor structure according to various embodiments of the present disclosure.

In FIG. 5A, a semiconductor substrate 510 is provided. In some embodiments, the semiconductor substrate 510 is a P-type semiconductor. For example, the semiconductor substrate 510 is doped with III-group elements, such as boron (B), aluminum (Al), gallium (Ga), indium (In) or a combination thereof.

Referring to FIG. 5A, a first semiconductor well 520 and a second semiconductor well 530 are formed in the semiconductor substrate 510. In which, the first semiconductor well 520 and the second semiconductor well 530 are completely separated by a region of the semiconductor substrate 510. According to various embodiments of the present disclosure, the first semiconductor well 520 and the second semiconductor well 530 are an lightly doped N-type semiconductor, which are doped with V-group elements, such as nitrogen (N), phosphor (P), arsenic (As), Antimony (Sb) or a combination thereof. The first semiconductor well 520 and the second semiconductor well 530 are formed in the semiconductor substrate 510 by using ion beam deposition (IBD), DC magnetron sputtering or gas cluster infusion.

Figure 5B:
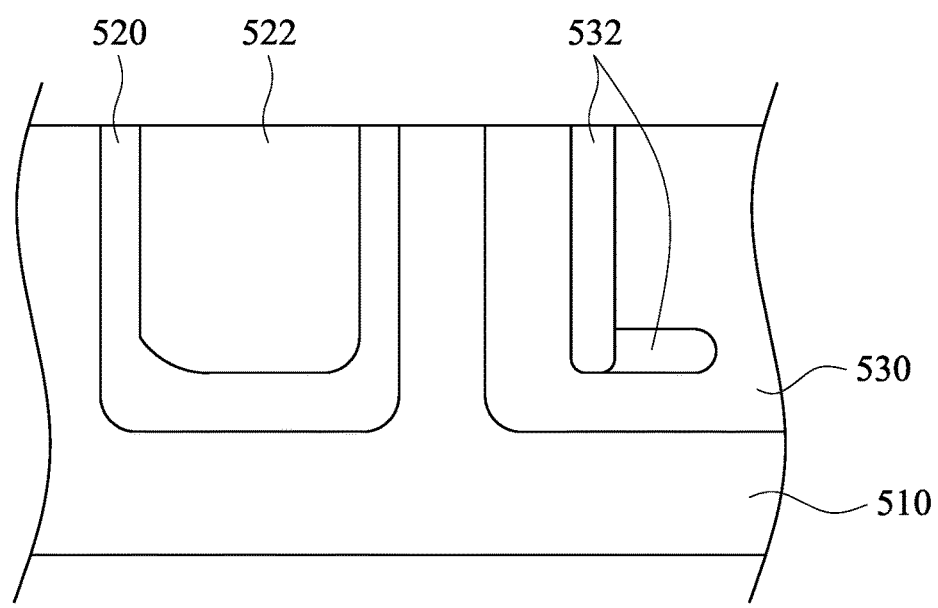

In FIG. 5B, a third semiconductor well 522 is formed in the first semiconductor well 520, and a semiconductor layer 532 is formed in the second semiconductor well 530.

According to various embodiments of the present disclosure, the third semiconductor well 522 and the semiconductor layer 532 are a P-type semiconductor as the semiconductor substrate 510.

In some embodiments, the semiconductor layer 532 has a horizontal portion and a vertical portion. And in other embodiments, the semiconductor layer 532 may be formed in the second semiconductor well 530 by two operations. The horizontal portion is formed in the second semiconductor well 530, and then the vertical portion is also formed in the second semiconductor well 530 and connected to the horizontal portion. According to various embodiments of the present disclosure, the horizontal portion and the vertical portion are completely separated by a region of the second semiconductor well 530.

Figure 5C:
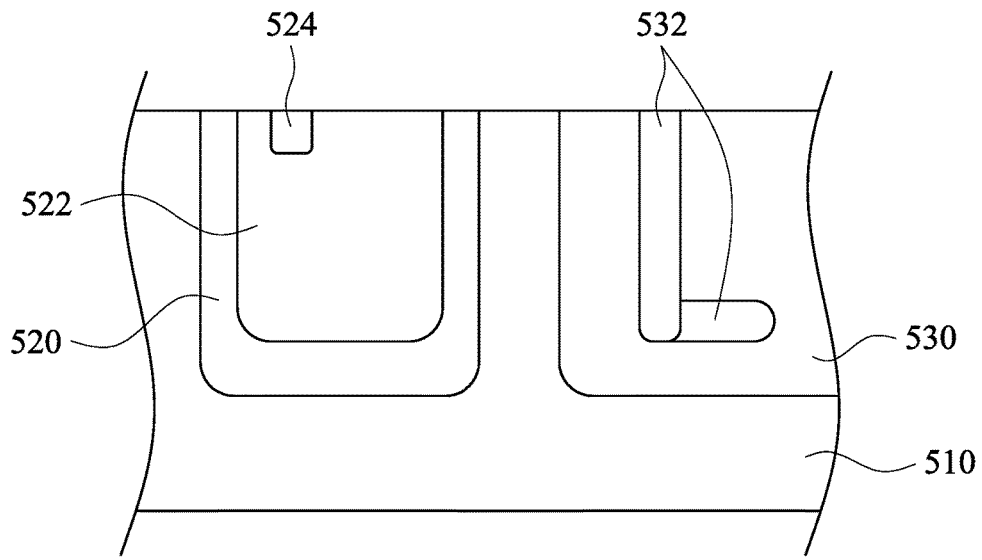

As shown in FIG. 5C, a fourth semiconductor well 524 is formed in the third semiconductor well 522. In some embodiments, the fourth semiconductor well 524 is a heavily doped P-type semiconductor.

Figure 5D:
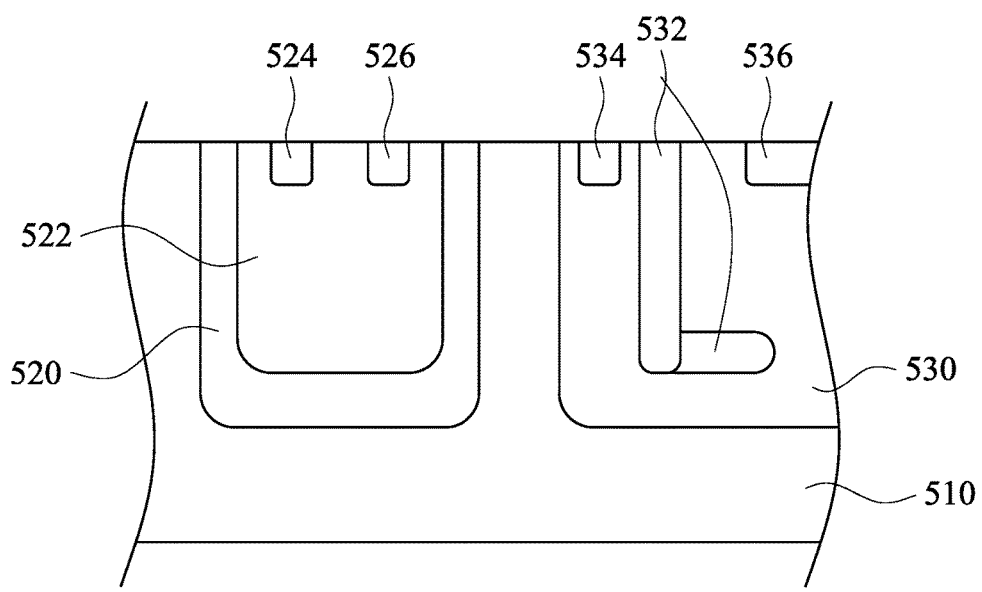

Referring to FIG. 5D, a fifth semiconductor well 526 is formed in the third semiconductor well 522, and a sixth semiconductor well 534 and a seventh semiconductor well 536 are formed in the second semiconductor well 530. In some embodiments, the fifth semiconductor well 526, the sixth semiconductor well 534 and the seventh semiconductor well 536 are a heavily doped N-type semiconductor.

According to various embodiments of the present disclosure, the forming method of the fourth semiconductor well 524, the fifth semiconductor well 526, the sixth semiconductor well 534 and the seventh semiconductor well 536 comprise ion beam deposition (IBD), DC magnetron sputtering or gas cluster infusion.

According to various embodiments of the present disclosure, the UHV semiconductor structure further includes an eighth semiconductor well formed between the third semiconductor well and the fifth semiconductor well.

Figure 5E:
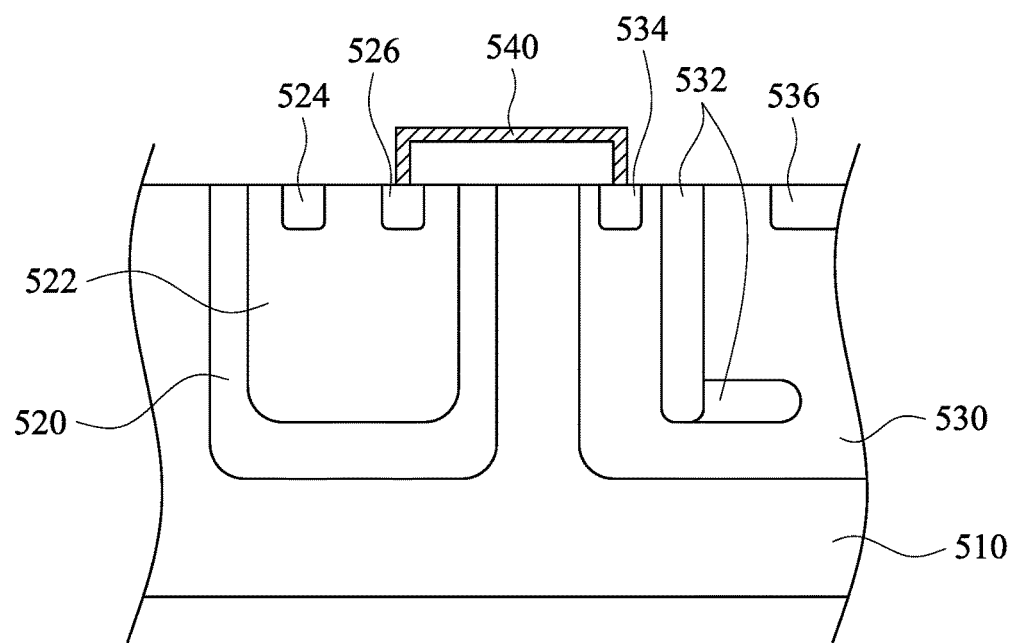

In FIG. 5E, a bridged conductive layer 540 is deposited on the fifth semiconductor well 526 and the sixth semiconductor well 534. In some embodiments, the bridged conductive layer 540 is formed of a conductive material, such as a metal, an alloy or a nonmetal conductor. In detailed description, the operations of forming the bridged conductive layer 540 may comprise lithography, deposition, etching process or a combination. For example, the deposition may be physical vapor deposition, chemical vapor deposition, atomic layer deposition or plasma-enhanced chemical vapor deposition. The etching process may be dry-etching process or wet-etching process.

Figure 5F:
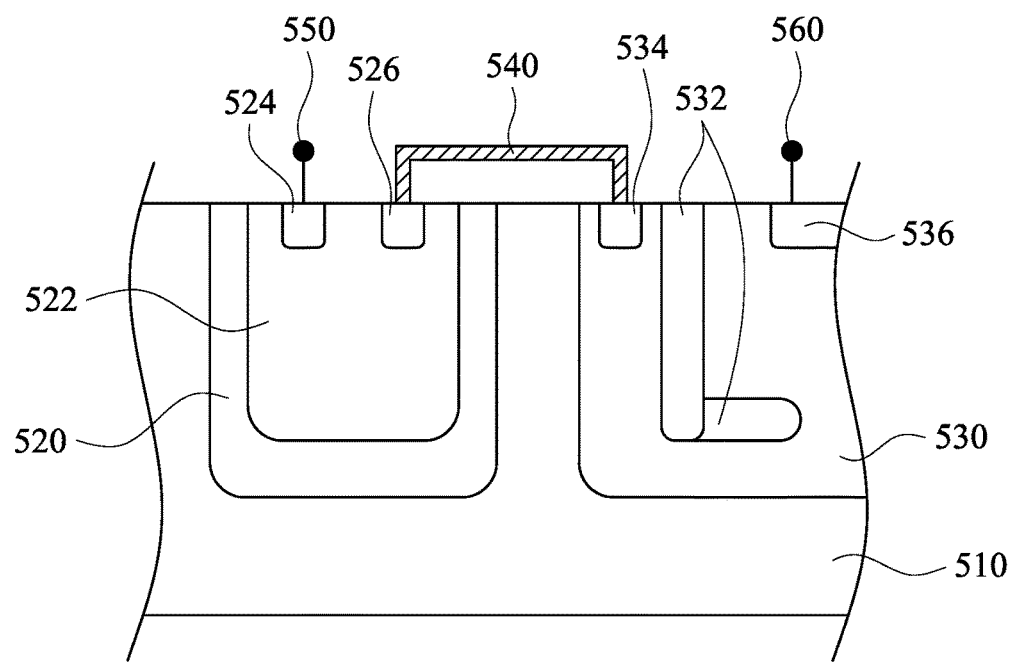

Referring to FIG. 5F, a first electrode 550 is formed on the fourth semiconductor well 524, and a second electrode 560 is formed on the seventh semiconductor well 536. Therefore, the UHV semiconductor structure 500 is provided. In some embodiments, the first electrode 550 is an anode, and the second electrode 560 is a cathode. And, the first electrode 550 and the second electrode 560 both are formed of metal, such as copper (Cu), aluminum (Al) or gold (Au).

Figure 6:
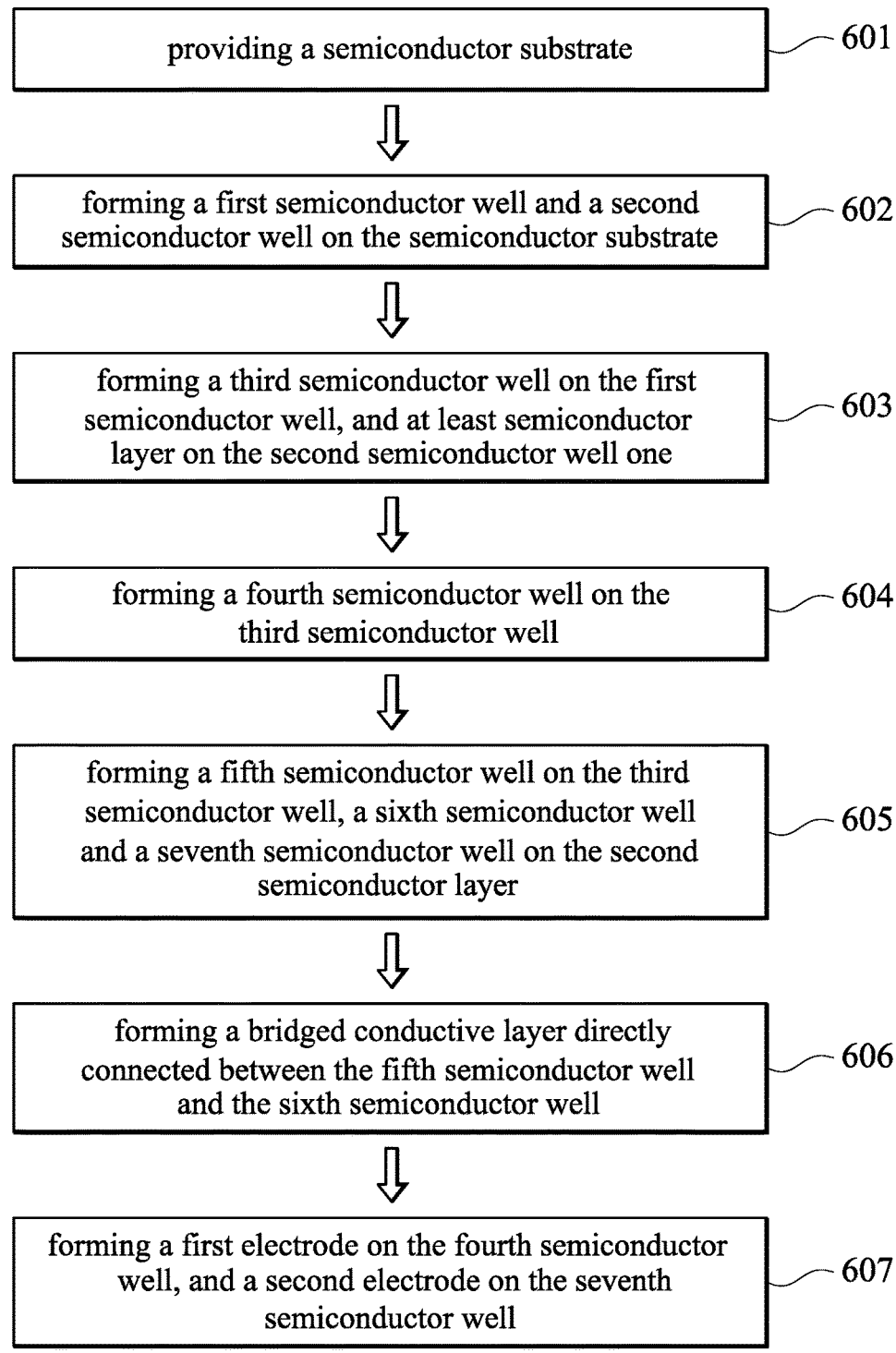
FIG. 6 is a flow chart illustrating a method of manufacturing an UHV semiconductor structure according to various embodiments of the present disclosure.

FIG. 6 is a flowchart illustrating a method of manufacturing an UHV semiconductor structure according to various embodiments of the present disclosure. The operations 601 to 607 are disclosed in association with the cross-sectional views of the UHV semiconductor structure 500 from FIGS. 5A to 5F at various fabrication stages.

In operation 601, a semiconductor substrate 510 is provided. Referring to FIG. 5A, the semiconductor substrate 510 is a P-type semiconductor. For example, the semiconductor substrate 510 is doped with III-group elements, such as boron (B), aluminum (Al), gallium (Ga), indium (In) or a combination thereof.

Still referring to the operation 602, a first semiconductor well 520 and a second semiconductor well 530 are formed in the semiconductor substrate 510. In FIG. 5A, the first semiconductor well 520 and the second semiconductor well 530 are completely separated by a region of the semiconductor substrate 510. In some embodiments, the first semiconductor well 520 and the second semiconductor well 530 are an lightly doped N-type semiconductor, which are doped with V-group elements, such as nitrogen (N), phosphor (P), arsenic (As), Antimony (Sb) or a combination thereof.

Referring to the operation 603, a third semiconductor well 522 is formed in the first semiconductor well 520, and at least one semiconductor layer 532 is formed in the second semiconductor well 530. In FIG. 5B, the semiconductor layer 532 is in an L-shape. In some embodiments, the third semiconductor well 522 and the semiconductor layer 532 are a P-type semiconductor as the semiconductor substrate 510.

According to various embodiments of the present disclosure, the fabricating method further includes applying a bias to the first semiconductor well, so that the potential of the first semiconductor well is much greater than the third semiconductor well.

According to various embodiments of the present disclosure, the fabricating method further includes applying a bias to the semiconductor layer, so that the potential of the semiconductor layer is lower than the second semiconductor well.

In the operation 604, a fourth semiconductor well 524 is formed in the third semiconductor well 522. In some embodiments, the fourth semiconductor well 524 is a heavily doped P-type semiconductor.

Referring to the operation 605, a fifth semiconductor well 526 is formed in the third semiconductor well 522, and a sixth semiconductor well 534 and a seventh semiconductor well 536 are formed in the second semiconductor well 530. As shown in FIG. 5D, the current along the geometrically shortest pathway between sixth semiconductor well 534 and the seventh semiconductor well 536 is obstructed. In some embodiments, the fifth semiconductor well 526, the sixth semiconductor well 534 and the seventh semiconductor well 536 are a heavily doped N-type semiconductor.

According to various embodiments of the present disclosure, the UHV semiconductor structure further includes an eighth semiconductor well formed between the third semiconductor well and the fifth semiconductor well. According to another embodiment of the present disclosure, the eighth semiconductor well is formed of an N-type semiconductor.

In the operation 606, a bridged conductive layer 540 is deposited and directly connected between the fifth semiconductor well 526 and the sixth semiconductor well 534. Referring to FIG. 5E, the bridged conductive layer 540 is pinched to connect the fifth semiconductor well 526 and the sixth semiconductor well 534. In some embodiments, the bridged conductive layer 540 is formed of a conductive material, such as a metal, an alloy or a nonmetal conductor.

Still referring to the operation 607, a first electrode 550 is formed on the fourth semiconductor well 524, and a second electrode 560 is formed on the seventh semiconductor well 536. As shown in FIG. 5F, the UHV semiconductor structure 500 is provided. In some embodiments, the first electrode 550 is an anode, and the second electrode 560 is a cathode. And, the first electrode 550 and the second electrode 560 both are formed of metal, such as copper (Cu), aluminum (Al) or gold (Au).

According to some embodiments of the present disclosure, a semiconductor structure includes a semiconductor substrate having a first electrical portion, a second electrical portion, and a bridged conductive layer. The first electrical portion includes a first semiconductor well, a second semiconductor well positioned in the first semiconductor well, a third semiconductor well and a fourth semiconductor well positioned in the second semiconductor well, and a first electrode electrically connected to the third semiconductor well. The second electrical portion includes a fifth semiconductor well, a semiconductor layer positioned in the fifth semiconductor well, a sixth semiconductor well and a seventh semiconductor well positioned in the fifth semiconductor well, and a second electrode. The semiconductor layer has a first portion and a second portion, and the first portion is separated from the second portion by a portion of the fifth semiconductor well. The second portion of the semiconductor layer is between the sixth semiconductor well and the seventh semiconductor well. The second electrode is electrically connected to the seventh semiconductor well. The bridged conductive layer connects the fourth semiconductor well of the first electrical portion and the sixth semiconductor well of the second electrical portion.

According to some embodiments of the present disclosure, a semiconductor structure includes a semiconductor substrate having a first electrical portion, a second electrical portion, and a bridged conductive layer. The first electrical portion includes a first semiconductor well, a second semiconductor well positioned in the first semiconductor well, a third semiconductor well and a fourth semiconductor well positioned in the second semiconductor well, a first electrode electrically connected to the third semiconductor well, and an eighth semiconductor well sandwiched between the second semiconductor well and the fourth semiconductor well. The second electrical portion includes a fifth semiconductor well, a semiconductor layer positioned in the fifth semiconductor well, a sixth semiconductor well and a seventh semiconductor well positioned in the fifth semiconductor well, and a second electrode. The semiconductor layer has a first portion and a second portion separated from each other. The second portion of the semiconductor layer is between the sixth semiconductor well and the seventh semiconductor well. The second electrode is electrically connected to the seventh semiconductor well. The bridged conductive layer connects the fourth semiconductor well of the first electrical portion and the sixth semiconductor well of the second electrical portion.

According to some embodiments of the present disclosure, a method for manufacturing a semiconductor structure includes forming a first semiconductor well and a second semiconductor well in a semiconductor substrate. A third semiconductor well is formed in the first semiconductor well, and a semiconductor layer is formed in the second semiconductor well, in which the semiconductor layer has a first portion and a second portion, and the first portion is separated from the second portion by a portion of the second semiconductor well. A fourth semiconductor well is formed in the third semiconductor well. A fifth semiconductor well is formed in the third semiconductor well, and a sixth semiconductor well and a seventh semiconductor well are formed in the second semiconductor well. A bridged conductive layer is deposited to connect the fifth semiconductor well and the sixth semiconductor well. A first electrode is formed on the fourth semiconductor well, and a second electrode is formed on the seventh semiconductor well.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A semiconductor structure, comprising:
a semiconductor substrate having a first electrical portion and a second electrical portion;
the first electrical portion comprising:
a first semiconductor well;
a second semiconductor well positioned in the first semiconductor well;
a third semiconductor well and a fourth semiconductor well positioned in the second semiconductor well; and
a first electrode electrically connected to the third semiconductor well;
the second electrical portion comprising:
a fifth semiconductor well;
a semiconductor layer positioned in the fifth semiconductor well, wherein the semiconductor layer has a first portion and a second portion, and the first portion is separated from the second portion by a portion of the fifth semiconductor well;
a sixth semiconductor well and a seventh semiconductor well positioned in the fifth semiconductor well, wherein the second portion of the semiconductor layer is between the sixth semiconductor well and the seventh semiconductor well; and
a second electrode electrically connected to the seventh semiconductor well; and
a bridged conductive layer connecting the fourth semiconductor well of the first electrical portion and the sixth semiconductor well of the second electrical portion.

2. The semiconductor structure of claim 1, wherein the first semiconductor well is separated from the fifth semiconductor well.

3. The semiconductor structure of claim 1, wherein a portion of the semiconductor substrate is between the first semiconductor well and the fifth semiconductor well.

4. The semiconductor structure of claim 3, wherein said portion of the semiconductor substrate between the first semiconductor well and the fifth semiconductor well comprises a P-type semiconductor.

5. The semiconductor structure of claim 4, wherein the first semiconductor well is an N-type semiconductor well.

6. The semiconductor structure of claim 4, wherein the fifth semiconductor well is an N-type semiconductor well.

7. The semiconductor structure of claim 1, wherein the bridged conductive layer is over the semiconductor substrate.

8. The semiconductor structure of claim 1, wherein the first portion is separated from a top surface of the semiconductor substrate.

9. The semiconductor structure of claim 1, wherein the second portion extends from a top surface of the semiconductor substrate.

10. A semiconductor structure, comprising:
a semiconductor substrate having a first electrical portion and a second electrical portion;
the first electrical portion comprising:
a first semiconductor well;
a second semiconductor well positioned in the first semiconductor well;
a third semiconductor well and a fourth semiconductor well positioned in the second semiconductor well;
a first electrode electrically connected to the third semiconductor well; and
an eighth semiconductor well sandwiched between the second semiconductor well and the fourth semiconductor well;
the second electrical portion comprising:
a fifth semiconductor well;
a semiconductor layer positioned in the fifth semiconductor well, wherein the semiconductor layer has a first portion and a second portion separated from each other;
a sixth semiconductor well and a seventh semiconductor well positioned in the fifth semiconductor well, wherein the second portion of the semiconductor layer is between the sixth semiconductor well and the seventh semiconductor well; and
a second electrode electrically connected to the seventh semiconductor well; and
a bridged conductive layer connecting the fourth semiconductor well of the first electrical portion and the sixth semiconductor well of the second electrical portion.

11. The semiconductor structure of claim 10, wherein the second portion extends from a top surface of the semiconductor substrate.

12. The semiconductor structure of claim 10, wherein the fifth semiconductor well has a portion between the first portion and the second portion.

13. The semiconductor structure of claim 10, wherein the fifth semiconductor well is an N-type semiconductor well.

14. The semiconductor structure of claim 13, wherein the first portion comprises a P-type semiconductor.

15. The semiconductor structure of claim 13, wherein the second portion comprises a P-type semiconductor.

16. The semiconductor structure of claim 10, wherein the fifth semiconductor well has a portion between a top surface of the semiconductor substrate and the first portion.

17. A method for manufacturing a semiconductor structure, comprising:
forming a first semiconductor well and a second semiconductor well in a semiconductor substrate;
forming a third semiconductor well in the first semiconductor well, and a semiconductor layer in the second semiconductor well, the semiconductor layer having a first portion and a second portion, the first portion being separated from the second portion by a portion of the second semiconductor well;
forming a fourth semiconductor well in the third semiconductor well;
forming a fifth semiconductor well in the third semiconductor well, a sixth semiconductor well and a seventh semiconductor well in the second semiconductor well;
depositing a bridged conductive layer connecting the fifth semiconductor well and the sixth semiconductor well; and
forming a first electrode on the fourth semiconductor well, and a second electrode on the seventh semiconductor well.

18. The method of claim 17, further comprising:
doping the semiconductor substrate with a Group III element.

19. The method of claim 17, wherein the forming the first semiconductor well and the second semiconductor well comprises:

doping the semiconductor substrate with a Group V element.

20. The method of claim 17, wherein the semiconductor layer comprises a P-type semiconductor.

* * * * *